United States Patent
Lee et al.

(10) Patent No.: US 10,637,436 B2
(45) Date of Patent: *Apr. 28, 2020

(54) BULK ACOUSTIC WAVE RESONATOR AND FILTER INCLUDING THE SAME

(71) Applicant: SAMSUNG ELECTRO-MECHANICS CO., LTD., Suwon-si (KR)

(72) Inventors: Tae Kyung Lee, Suwon-si (KR); Sung Han, Suwon-si (KR); Hwa Sun Lee, Suwon-si (KR); Seung Joo Shin, Suwon-si (KR); Ran Hee Shin, Suwon-si (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 15/992,606

(22) Filed: May 30, 2018

(65) Prior Publication Data

US 2018/0278232 A1    Sep. 27, 2018

Related U.S. Application Data

(63) Continuation of application No. 15/184,230, filed on Jun. 16, 2016, now Pat. No. 10,009,007.

(30) Foreign Application Priority Data

Jun. 16, 2015  (KR) .................. 10-2015-0085236
Jun. 15, 2016  (KR) .................. 10-2016-0074741

(51) Int. Cl.
H03H 9/13  (2006.01)
H03H 9/54  (2006.01)
(Continued)

(52) U.S. Cl.
CPC .......... H03H 9/13 (2013.01); H03H 9/02015 (2013.01); H03H 9/02149 (2013.01);
(Continued)

(58) Field of Classification Search
CPC .. H03H 9/02086; H03H 9/02149; H03H 9/13; H03H 9/171; H03H 9/173;
(Continued)

(56) References Cited

U.S. PATENT DOCUMENTS

| 7,173,361 B2 | 2/2007 | Saito et al. |
| 10,009,007 B2 * | 6/2018 | Lee .................... H03H 9/02149 |
| 2004/0135144 A1 | 7/2004 | Yamada et al. |
| 2005/0093397 A1 | 5/2005 | Yamada et al. |

(Continued)

FOREIGN PATENT DOCUMENTS

| CN | 102957397 A | 3/2013 |
| CN | 103312288 A | 9/2013 |

(Continued)

OTHER PUBLICATIONS

Chine Office Action dated Apr. 10, 2018 in corresponding Chinese Patent Application No. 201610428988.0 (9 pages in English, 6 pages in Chinese).

*Primary Examiner* — Barbara Summons
(74) *Attorney, Agent, or Firm* — NSIP Law

(57) ABSTRACT

A bulk acoustic wave resonator includes a substrate, a first electrode and a second electrode disposed on the substrate, and a piezoelectric layer disposed between the first electrode and the second electrode. At least one of the first electrode and the second electrode includes an alloy of molybdenum and tantalum.

9 Claims, 5 Drawing Sheets

(51) Int. Cl.
*H03H 9/02* (2006.01)
*H03H 9/17* (2006.01)
*H03H 3/02* (2006.01)

(52) U.S. Cl.
CPC .............. *H03H 9/173* (2013.01); *H03H 9/54* (2013.01); *H03H 3/02* (2013.01); *H03H 2003/021* (2013.01)

(58) Field of Classification Search
CPC .......... H03H 9/54; H03H 9/568; H03H 9/587; H03H 9/605; H03H 9/02015; H03H 3/02; H03H 2003/021; H01L 41/18; H01L 41/297
USPC .................................................. 333/187, 189
See application file for complete search history.

(56) References Cited

U.S. PATENT DOCUMENTS

| | | |
|---|---|---|
| 2007/0115078 A1 | 5/2007 | Sano et al. |
| 2008/0081398 A1 | 4/2008 | Lee et al. |
| 2008/0143457 A1 | 6/2008 | Jhung |
| 2010/0134210 A1 | 6/2010 | Umeda |
| 2011/0132866 A1 | 6/2011 | Pijolat |
| 2013/0049544 A1 | 2/2013 | Yokoyama |
| 2013/0241673 A1 | 9/2013 | Yokoyama et al. |
| 2018/0183407 A1* | 6/2018 | Lee ................ H03H 9/171 |

FOREIGN PATENT DOCUMENTS

| | | |
|---|---|---|
| JP | 2006-278579 A | 10/2006 |
| JP | 2009-194895 A | 8/2009 |

* cited by examiner

BULK ACOUSTIC WAVE RESONATOR AND FILTER INCLUDING THE SAME

CROSS-REFERENCE TO RELATED APPLICATION(S)

This application is a continuation of U.S. application Ser. No. 15/184,230 filed on Jun. 16, 2016 which claims the benefit under 35 USC § 119(a) of Korean Patent Applications No. 10-2015-0085236 filed on Jun. 16, 2015 and No. 10-2016-0074741 filed on Jun. 15, 2016 in the Korean Intellectual Property Office, the entire disclosures of each of which are incorporated herein by reference for all purposes.

BACKGROUND

1. Field

The present disclosure relates to a bulk acoustic wave resonator and a filter including the same.

2. Description of Related Art

In accordance with the recent rapid development of mobile communications devices, chemical and biological devices, and the like, demand for small, lightweight filters, oscillators, resonant elements, acoustic resonant mass sensors, and the like has increased.

As a means for implementing such small, lightweight filters, oscillators, resonant elements, acoustic resonant mass sensors, and the like, a bulk acoustic resonator has commonly been used. Such a bulk acoustic resonator has positive attributes in that it may be mass-produced at a minimal cost and may be subminiaturized. Further, the bulk acoustic resonator has advantages in that it may implement a high quality Q factor, a main property of a filter; may be used in a micro-frequency band; and may particularly be implemented in bands of personal communication system (PCS) and digital cordless system (DCS).

Generally, the bulk acoustic resonator has a structure including a resonating part implemented by sequentially laminating a lower electrode, a piezoelectric layer, and an upper electrode on a substrate. When an electric field is maintained in the piezoelectric layer by applying electrical energy to the lower and upper electrodes, the electric field causes a piezoelectric phenomenon in the piezoelectric layer, thereby causing the resonating part to be vibrated in a predetermined direction. As a result, an acoustic wave is generated in the same direction as the vibration direction of the resonating part, thereby causing resonance.

SUMMARY

An exemplary embodiment in the present disclosure may provide a bulk acoustic wave resonator in which reliability may be secured by preventing oxidation of electrodes and crystal orientation of a piezoelectric layer formed on an electrode may be improved.

According to an exemplary embodiment in the present disclosure, at least one of a plurality of electrodes of a bulk acoustic wave resonator may be formed using an alloy of molybdenum and tantalum.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
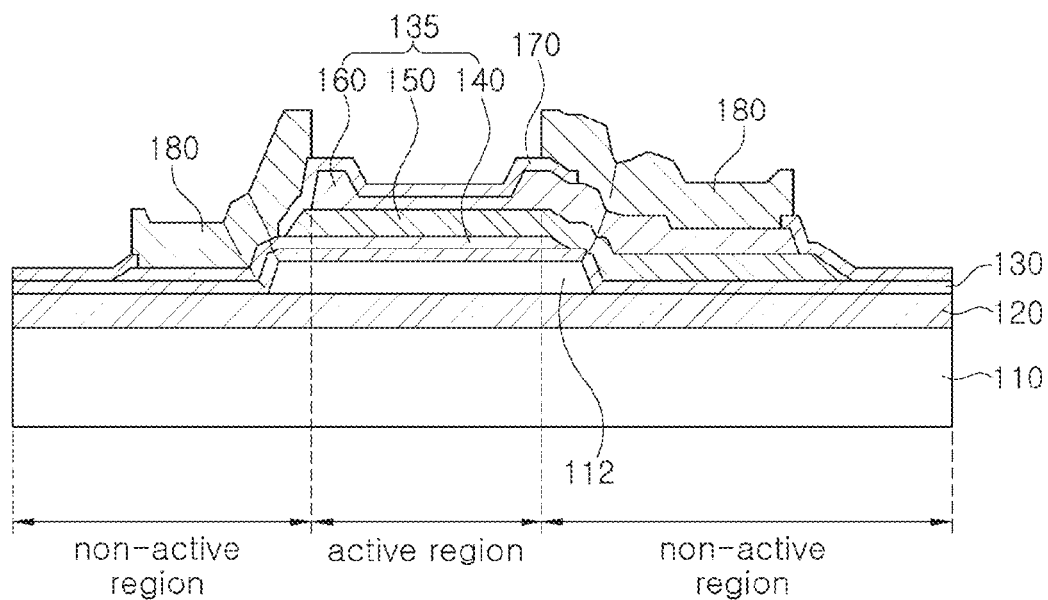
FIG. 1 is a cross-sectional view illustrating a bulk acoustic wave resonator according to an embodiment.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and propose only a required configuration herein, but are not limited thereto.

FIG. 1 is a cross-sectional view illustrating a bulk acoustic wave resonator according to an embodiment.

Referring to FIG. 1, a bulk acoustic wave resonator 100 according to an embodiment is a film bulk acoustic resonator (hereinafter, referred to as "FBAR") and includes a substrate 110, an insulating layer 120, an air cavity 112, and a resonating part 135.

The substrate 110 is configured of a silicon substrate, and the insulating layer 120 is disposed on an upper surface of the substrate 110 to electrically insulate the resonating part 135 from the substrate 110.

The insulating layer 120 is formed by depositing at least one of $SiO_2$, $Si_3N_4$, $Al_2O_2$, and AlN on the substrate 110 by one of a chemical vapor deposition method, an RF magnetron sputtering method, and an evaporation method.

The air cavity 112 is disposed above the substrate 110. The air cavity 112 is disposed below the resonating part 135 in such a manner that the resonating part 135 may be vibrated in a predetermined direction. The air cavity 112 is formed by processes of forming a sacrificial air cavity layer pattern on the insulating layer 120, then forming a membrane 130 on the sacrificial air cavity layer pattern, and etching and removing the sacrificial air cavity layer pattern. The membrane 130 may serve as an oxidation protection layer or serve as a protection layer protecting the substrate 110. Although not illustrated in FIG. 1, a seed layer formed using aluminum nitride (AlN) is disposed on the membrane 130. In detail, the seed layer is disposed between the membrane 130 and a first electrode 140.

Although not illustrated in FIG. 1, an etch-stop layer may be further formed on the insulating layer 120. The etch-stop layer may serve to protect the substrate 110 and the insulating layer 120 from an etching process for removing a sacrificial layer pattern and may serve as a base necessary to deposit various other layers on the etch-stop layer.

The resonating part 135 may include the first electrode 140, a piezoelectric layer 150, and a second electrode 160 which are sequentially laminated.

The first electrode 140 is provided in a form extended from a position on an upper portion of the insulating layer 120 to a position of the membrane 130 disposed on the air cavity 112, to cover a portion of the membrane 130. The piezoelectric layer 150 is formed on a portion of the first electrode 140 disposed on the air cavity 112. The second electrode 160 is formed to be extended from a position on another upper portion of the insulating layer 120 to a position of the piezoelectric layer 150 disposed above the air cavity 112, to be disposed on the piezoelectric layer 150. A common region in which the first electrode 140, the piezoelectric layer 150, and the second electrode 160 overlap each other in a vertical direction is disposed above the air cavity 112.

The piezoelectric layer 150, a part in which a piezoelectric effect is generated by converting electrical energy into mechanical energy of an acoustic wave type, is formed of one of aluminum nitride (AlN), zinc oxide (ZnO), and lead zirconium titanium oxide (PZT; PbZrTiO). The piezoelectric layer 150 may further include a rare earth metal. As an example, the rare earth metal may include at least one of Sc, Er, Y, and La.

The resonating part 135 may be classified as having an active region and non-active regions. The active region of the resonating part 135 is a region vibrated in a predetermined direction by a piezoelectric phenomenon generated in the piezoelectric layer 150 when electrical energy such as radio frequency (RF) signals is applied to the first and second electrodes 140 and 160, and corresponds to a region in which the first electrode 140, the piezoelectric layer 150, and the second electrode 160 overlap each other in a vertical direction above the air cavity 112. The non-active regions of the resonating part 135 are regions which are not resonated by the piezoelectric phenomenon even in the case that electrical energy is applied to the first and second electrodes 140 and 160, and correspond to outer regions of the active region.

The resonating part 135 outputs a radio frequency signal having a specific frequency using a piezoelectric phenomenon, and in detail, outputs a radio frequency signal having a resonance frequency corresponding to a degree of vibration based on the piezoelectric phenomenon of the piezoelectric layer 150.

A protection layer 170 is disposed on the second electrode 160 of the resonating part 135 to prevent the second electrode 160 from being exposed externally and oxidized, and an electrode pad 180 to allow an electrical signal to be applied is formed on portions of the first electrode 140 and the second electrode 160 which are exposed externally.

Figure 2:
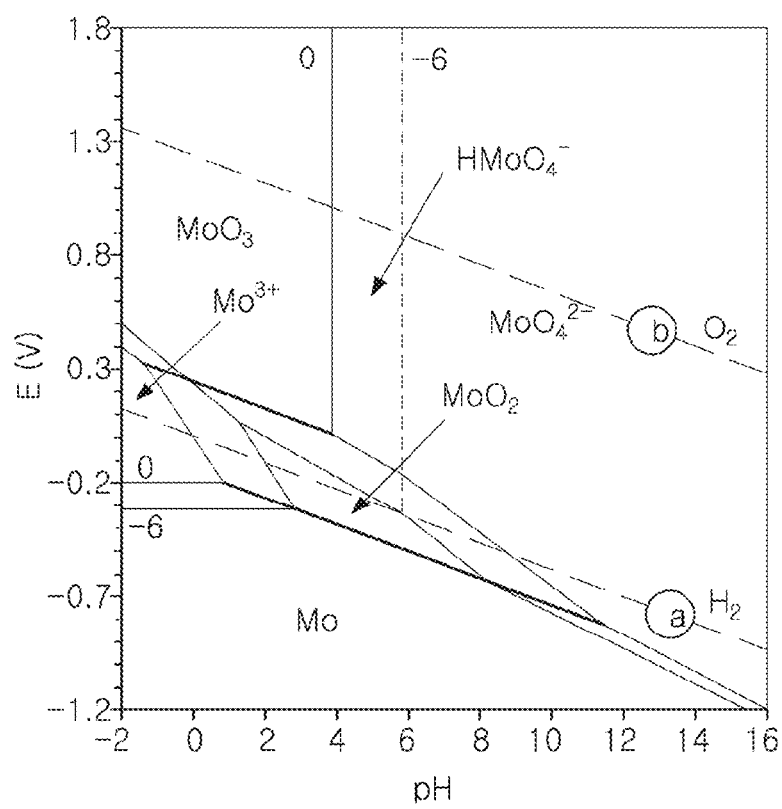
FIG. 2 is Pourbaix diagrams of molybdenum (Mo)

FIG. 2 is Pourbaix diagrams of molybdenum (Mo).

The first and second electrodes 140 and 160 are generally formed of one of gold (Au), titanium (Ti), tantalum (Ta), molybdenum (Mo), ruthenium (Ru), platinum (Pt), tungsten (W), aluminum (Al), iridium (Ir), and nickel (Ni). In detail, in order to increase crystal orientation of the piezoelectric layer 150, molybdenum (Mo) is used.

However, referring to FIG. 2, molybdenum (Mo) may have problems that it tends to be dissolved at a pH of 4 to 7 and tends to be oxidized in other pH regions. In order to solve the above-mentioned problems, molybdenum (Mo) is hermetically sealed to be passivation-treated.

However, even in the case that molybdenum (Mo) is passivation-treated as described above, when molybdenum (Mo) is exposed to moisture at the time of performing a moisture treatment process, it will be apprehended that molybdenum (Mo) is oxidized. Since oxidized molybdenum (Mo) also has relatively high solubility, it may cause a reliability problem. For example, in order to connect the first electrode 140 to an external circuit, when a specific region of the first electrode 140 is exposed by a trench and is then connected to the electrode pad 180 of FIG. 1, connection and contact defects may be caused.

In order to solve the above-mentioned problems, in a case in which the first and second electrodes 140 and 160 are formed of metals other than molybdenum (Mo), problems that high specific resistance is involved and orientation is decreased at the time of depositing the piezoelectric layer 150 may occur.

According to an embodiment, the first and second electrodes 140 and 160 include a molybdenum (Mo) alloy. As an example, one of the first and second electrodes 140 and 160 is formed using a molybdenum (Mo)-tantalum (Ta) alloy.

According to an embodiment, one of the first and second electrodes 140 and 160 is formed of a molybdenum (Mo)-tantalum (Ta) alloy, to implement relatively low specific resistance characteristics of the first and second electrodes 140 and 160 and easily perform an etching process. Further, relatively high crystal orientation of the piezoelectric layer 150 may be obtained.

Further, in the molybdenum (Mo)-tantalum (Ta) alloy, the content of tantalum (Ta) is 0.1 to 50 atm %, in detail, 0.1 to 30 atm %.

Figure 3:
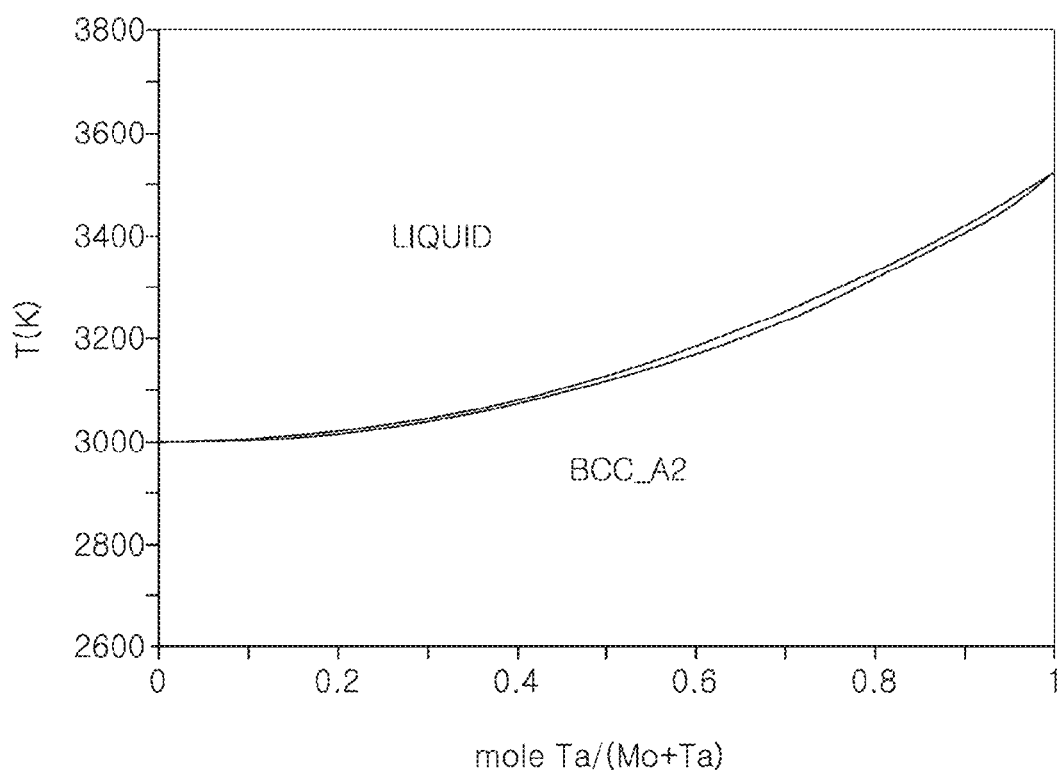
FIG. 3 illustrates a phase diagram for a molybdenum (Mo)-tantalum (Ta) alloy.

FIG. 3 illustrates a phase diagram for a molybdenum (Mo)-tantalum (Ta) alloy.

Referring to FIG. 3, the molybdenum (Mo)-tantalum (Ta) is a homogeneous solid solution formed in a single phase when a temperature is decreased in a liquid phase, and has the same atomic structure such as a body-centered cubic (BCC). Thus, for example, when the first electrode 140 is formed using the molybdenum (Mo)-tantalum (Ta) alloy, crystal orientation characteristics of the piezoelectric layer formed on the first electrode 140 are improved.

With reference to FIG. 3, when the content of Ta in the molybdenum (Mo)-tantalum (Ta) alloy is 30 atm % or less, a melting temperature thereof is substantially constant, while in a case in which the content of Ta in the molybdenum (Mo)-tantalum (Ta) alloy exceeds 30 atm %, a melting temperature thereof is rapidly increased to cause a problem in forming the first and second electrodes 140 and 160 using the molybdenum (Mo)-tantalum (Ta) alloy.

Thus, according to an embodiment in the present disclosure, the first and second electrodes 140 and 160 may be easily formed using the molybdenum (Mo)-tantalum (Ta) alloy including 0.1 to 30 atm % of Ta.

Figure 4:
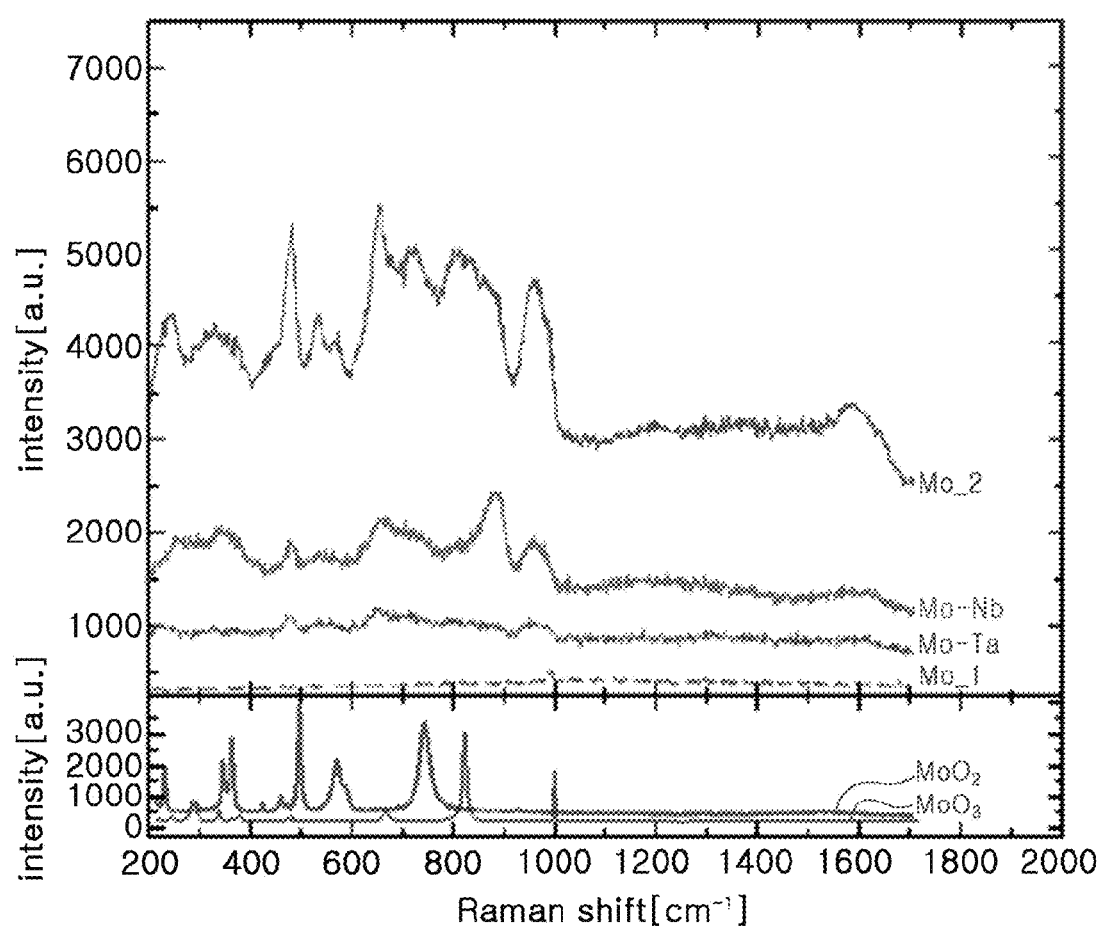
FIG. 4 illustrates a Raman shift for each type of molybdenum (Mo) alloy.

FIG. 4 illustrates a Raman shift for each type of molybdenum (Mo) alloy. In detail, FIG. 4 illustrates a result of a Raman shift after an 8585 reliability test (a test under a temperature of 85° C. and humidity of 85%) is performed for a sample of the molybdenum (Mo) alloy. In FIG. 4, the content of niobium (Nb) in a molybdenum (Mo)-niobium (Nb) alloy is 4.2 to 6.2 atm %, and the content of Ta in the molybdenum (Mo)-tantalum (Ta) alloy is 3.3 to 3.8 atm %.

In FIG. 4, a Raman shift for molybdenum oxide ($MoO_2$, $MoO_3$) refers to a reference peak. It can be appreciated that in a Raman shift of molybdenum (Mo_1) in which a 8585 reliability test is not performed, a peak similar to that of a graph of molybdenum oxide ($MoO_2$, $MoO_3$) is not detected, but in a Raman shift of molybdenum (Mo_2) in which the 8585 reliability test is performed, a peak similar to that of the graph of molybdenum oxide ($MoO_2$, $MoO_3$) is detected and oxidized. It can also be seen that a result similar thereto is obtained in the Mo—Nb alloy.

However, a Raman shift for a Mo—Ta alloy is maintained at a substantially constant value, from which it can be seen that in the case of the Mo—Ta alloy, oxidization only slightly occurs.

Thus, according to an embodiment, at least one of the first and second electrodes 140 and 160 is formed of the molybdenum (Mo)-tantalum (Ta) alloy. Thereby, the oxidation problem which is caused when pure molybdenum (Mo) is used is solved, thereby increasing environmental reliability.

Figure 5:
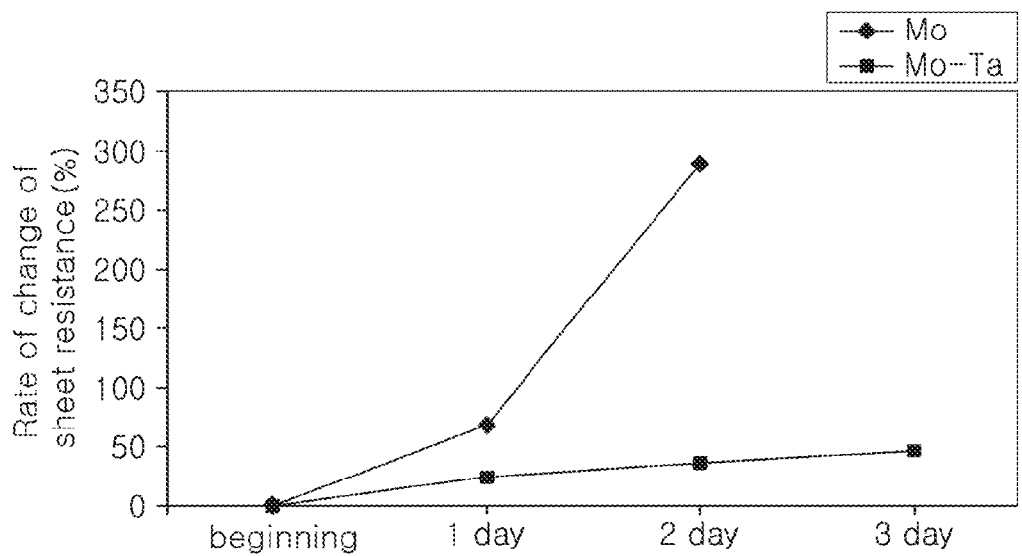
FIG. 5 illustrates a change in sheet resistance of a molybdenum (Mo)-tantalum (Ta) alloy according to an embodiment.

FIG. 5 illustrates a change in sheet resistance of a molybdenum (Mo)-tantalum (Ta) alloy according to an embodiment. In detail, FIG. 5 illustrates a result of a change in sheet resistance after an 8585 reliability test (a test under a temperature of 85° C. and humidity of 85%) was performed on a sample of the molybdenum (Mo) alloy.

It can be seen from the 8585 reliability test that sheet resistance of pure molybdenum (Mo) was sharply increased after two days after the deposition and was outside of a measurement range, but the molybdenum (Mo)-tantalum (Ta) alloy had a rate of change (%) of sheet resistance less than 50%, even after three days and sheet resistance thereof was not significantly changed even in a high temperature and humidity environment.

The following Table 1 is provided to illustrate etching characteristics of a molybdenum (Mo) alloy according to an embodiment.

As described above, the air cavity 112 is formed by etching the sacrificial air cavity layer pattern. An etching process of the sacrificial air cavity layer pattern is performed using xenon fluoride ($XeF_2$). Here, the etching process is performed after one of the first and second electrodes 140 and 160 with reference to FIG. 1 is formed. In a case in which the electrode is unnecessarily etched or corrodes by the etching process, a problem in which reliable resonance characteristics of the bulk acoustic wave resonator is not secured may occur.

According to an embodiment, the electrode is formed of the molybdenum (Mo)-tantalum (Ta) alloy to secure robust characteristics for the etching material.

Table 1 is a table illustrating etching characteristics of pure molybdenum (Mo) and a molybdenum (Mo)-tantalum (Ta) alloy for xenon fluoride ($XeF_2$). In order to perform a test of Table 1, after pure molybdenum (Mo) and a molybdenum (Mo)-tantalum (Ta) alloy were deposited, a portion of a deposition layer was removed by a circle having a diameter of 30 μm and a predetermined deposition thickness, and an inner portion of the circle was etched with xenon fluoride ($XeF_2$).

TABLE 1

|  | Thickness of Deposition | Diameter of Circle | Amount of Etching |
| --- | --- | --- | --- |
| Molybdenum (Mo) | 224 nm | 68.99 μm | 38.99 μm |
| Molybdenum (Mo)-Tantalum (Ta) Alloy | 136 nm | 51.13 μm | 21.13 μm |

As can be seen from Table 1, a diameter of a circle of pure molybdenum (Mo) is increased from 30 μm to 68.99 μm, such that 38.99 μm is etched, while a diameter of a circle of a molybdenum (Mo)-tantalum (Ta) alloy is increased from 30 μm to 51.13 μm, such that 21.13 μm is etched. It is seen that the molybdenum (Mo)-tantalum (Ta) alloy was etched less than molybdenum (Mo) by about 50%, and it is seen that when a thickness of deposition is considered, the molybdenum (Mo)-tantalum (Ta) alloy was etched less than molybdenum (Mo) by about 25%.

In detail, even in a case in which the molybdenum (Mo)-tantalum (Ta) alloy is inevitably exposed externally under the etching environment of the sacrificial air cavity layer pattern, reliability may be secured due to robust characteristics for xenon fluoride ($XeF_2$).

Figure 6A:
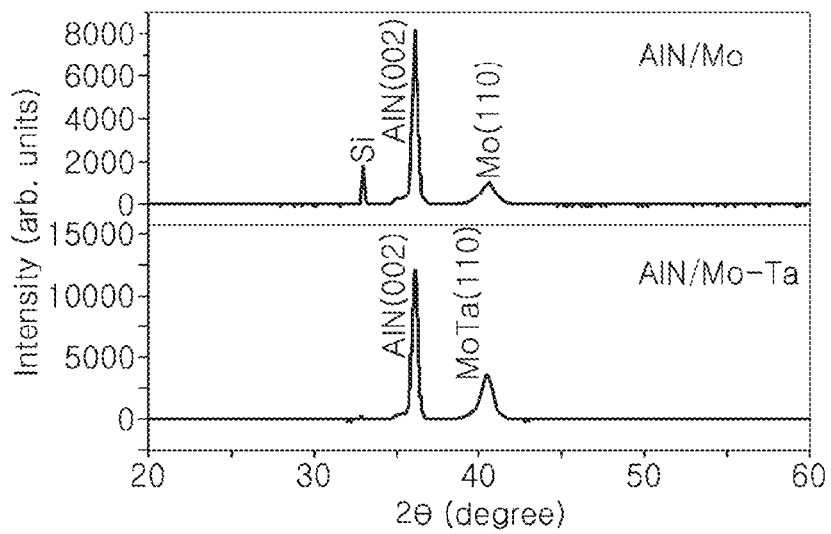
FIGS. 6A and 6B are diagrams illustrating crystal orientation of aluminum nitride (AlN) at a molybdenum (Mo)-tantalum (Ta) alloy phase according to an embodiment.
Figure 6B:
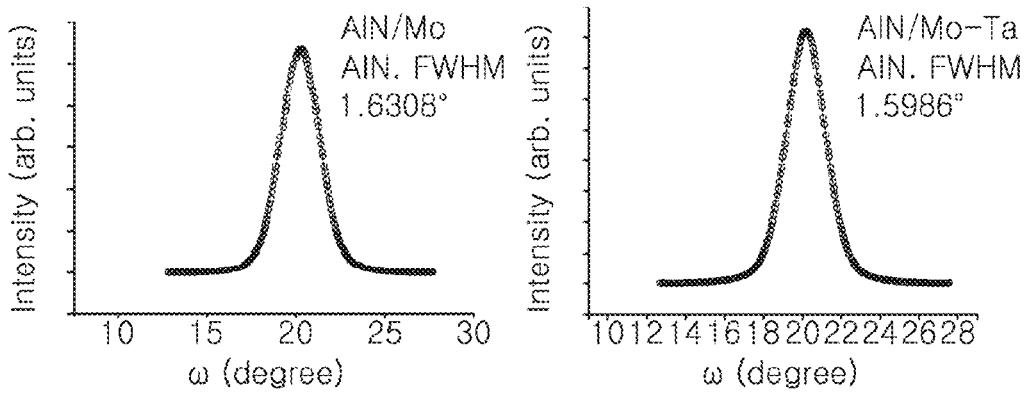

FIGS. 6A and 6B are diagrams illustrating crystal orientation of aluminum nitride (AlN) in a molybdenum (Mo)-tantalum (Ta) alloy phase according to an embodiment.

FIG. 6A illustrates a rocking curve in a case in which aluminum nitride (AlN) is deposited on molybdenum (Mo) and molybdenum (Mo)-tantalum (Ta) alloy phases, and FIG. 6B illustrates full width at half maximum (FWHM) in a case in which aluminum nitride (AlN) is deposited on molybdenum (Mo) and molybdenum (Mo)-tantalum (Ta) alloy phases. In the case that aluminum nitride (AlN) is deposited on molybdenum (Mo) and molybdenum (Mo)-tantalum (Ta) alloy phases, the molybdenum (Mo) alloy and the molybdenum (Mo)-tantalum (Ta) alloy were formed to respectively have a thickness of 0.23 μm, and the aluminum nitride (AlN) was formed to have a thickness of 0.9 μm.

Referring to FIG. 6A, it is seen that aluminum nitride (AlN) is grown in a c-axis orientation ([0002] direction) on all of molybdenum (Mo)-tantalum (Ta) alloy and pure molybdenum (Mo) phases. However, referring to FIG. 6B, it is seen that a FWHM of aluminum nitride (AlN) is 1.6308° on pure Mo, while is 1.5986° on the Mo—Ta alloy. Thus, it can be appreciated that the FWHM of aluminum nitride (AlN) exhibits a smaller value under the molybdenum (Mo)-tantalum (Ta) alloy rather than pure molybdenum (Mo). For example, a relatively high degree of crystal orientation may be obtained in a case in which the piezoelectric layer 150 formed of aluminum nitride (AlN) is formed on the Mo—Ta alloy phase, rather than forming a piezoelectric layer formed of AlN on the pure Mo phase.

Table 2 is a table illustrating values measured by manufacturing a resonator of the embodiment of the present disclosure in which an electrode is formed using a Mo—Ta alloy and a resonator of a comparative example in which an electrode is formed of Mo. In the embodiment of the present disclosure, the first electrode 140 and the second electrode 160 of FIG. 1 were manufactured using a Mo—Ta alloy to have thicknesses of 0.23 μm and 0.24 μm, respectively. In the comparative example, the first electrode 140 and the second electrode 160 of FIG. 1 were manufactured using Mo to have thicknesses of 0.23 μm and 0.24 μm, respectively.

TABLE 2

|  | Leakage Current (nA) | Leakage Density (A/cm$^2$) | Fs(MHz) | Fp(MHz) | Kt$^2$ |
| --- | --- | --- | --- | --- | --- |
| Embodiment | 0.000 | 0 | 2615.92 | 2687.95 | 6.44 |
| Comparative Example | 0.168 | 1.675*10$^{-6}$ | 2621.19 | 2687.39 | 5.93 |

In Table 2, a level of leakage current was measured by applying a voltage of 20V to a resonator. In the case of the embodiment, a leakage current was not detected, while in the case of the comparative example, the leakage current of 0.168 nA was detected. A leakage density corresponding to a level of leakage current detected per area of a resonator was calculated as 1.675*10$^{-6}$. Thus, it can be appreciated that a relatively high degree of crystal orientation may be obtained in the case that the piezoelectric layer 150 formed of aluminum nitride (AlN) is formed on the Mo—Ta alloy phase, rather than forming a piezoelectric layer formed of AlN on the pure Mo phase.

According to an embodiment in the present disclosure, a leakage current of a resonator may be reduced by manufacturing an electrode using a Mo—Ta alloy.

In addition, in the case of Embodiment of Table 2, a squared value Kt$^2$ of an effective electromechanical coupling coefficient is measured as 6.44, and in the case of Comparative example, a squared value Kt$^2$ of an effective electromechanical coupling coefficient is measured as 5.93.

According to an embodiment in the present disclosure, the squared value Kt$^2$ of an effective electromechanical coupling coefficient may be improved by manufacturing an electrode using a Mo—Ta alloy.

Figure 7:
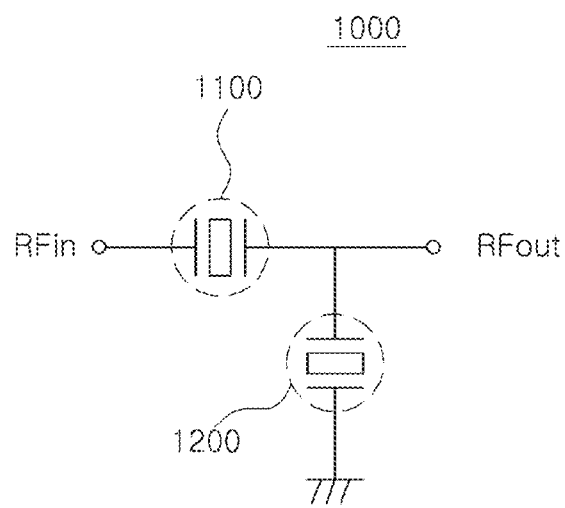
FIGS. 7 and 8 are schematic circuit diagrams of filters according to exemplary embodiments.
Figure 8:
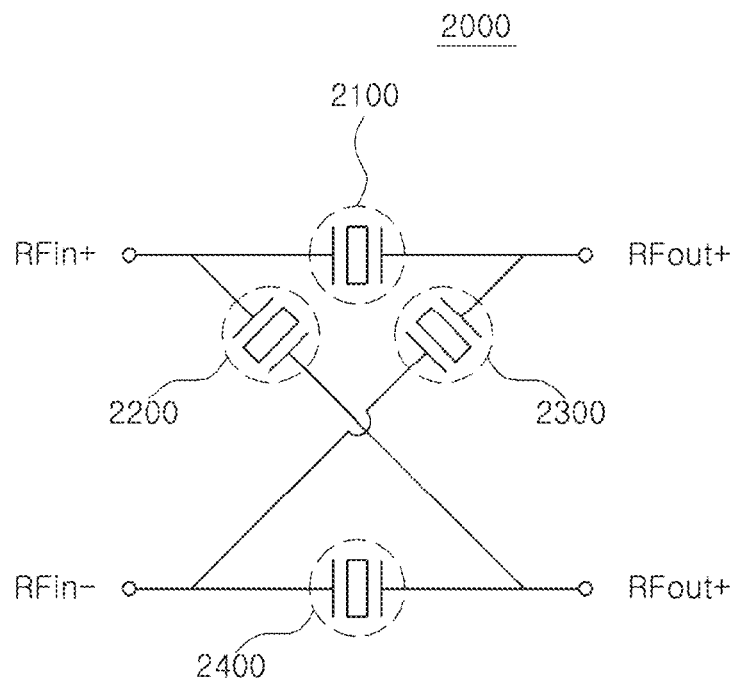

FIGS. 7 and 8 are schematic circuit diagrams of filters according to embodiments.

Each of a plurality of bulk acoustic wave resonators employed in the filters of FIGS. 7 and 8 corresponds to the bulk acoustic wave resonator illustrated in FIG. 1.

Referring to FIG. 7, a filter 1000 according to an embodiment is formed in a ladder type filter structure. In detail, the filter 1000 may include a plurality of bulk acoustic wave resonators 1100 and 1200.

A first bulk acoustic wave resonator 1100 is connected between a signal input terminal to which an input signal RFin is input and a signal output terminal from which an output signal RFout is output in series, and a second bulk acoustic wave resonator 1200 is connected between the signal output terminal and a ground.

Referring to FIG. 8, a filter 2000 according to an embodiment is formed in a lattice-type filter structure. In detail, the filter 2000 includes a plurality of bulk acoustic wave resonators 2100, 2200, 2300, and 2400 to filter balanced input signals RFin+ and RFin− and output balanced output signals RFout+ and RFout−.

As set forth above, according to embodiments in the present disclosure, a bulk acoustic wave resonator may secure reliability by preventing oxidation of electrodes.

In addition, robust characteristics may be secured from an etching material used in a process of manufacturing a bulk acoustic wave resonator.

While embodiments have been shown and described above, it will be apparent to those skilled in the art that modifications and variations could be made without departing from the scope of the present invention as defined by the appended claims.

What is claimed is:

1. A bulk acoustic wave resonator comprising:
a substrate;
a first electrode and a second electrode disposed on the substrate; and
a piezoelectric layer disposed between the first electrode and the second electrode and comprising a rare earth metal,
wherein at least one of the first electrode and the second electrode includes an alloy of molybdenum and tantalum, and
wherein a content of the tantalum (Ta) is 0.1 to 30 atm%.

2. The bulk acoustic wave resonator of claim 1, wherein the piezoelectric layer comprises aluminum nitride.

3. The bulk acoustic wave resonator of claim 1, further comprising an air cavity disposed between the substrate and the first electrode,
wherein a sacrificial air cavity layer pattern for formation of the air cavity is etched by xenon fluoride.

4. The bulk acoustic wave resonator of claim 3, wherein the sacrificial air cavity layer pattern is etched after at least one of the first electrode and the second electrode is formed.

5. A filter comprising:
a plurality of bulk acoustic wave resonators,
wherein each of the plurality of bulk acoustic wave resonators includes:

a substrate;

a first electrode and a second electrode disposed on the substrate; and a piezoelectric layer disposed between the first electrode and the second electrode and comprising a rare earth metal, and at least one of the first electrode and the second electrode includes an alloy of molybdenum and tantalum, and a content of the tantalum (Ta) is 0.1 to 30 atm%.

6. The filter of claim 5, wherein the piezoelectric layer comprises aluminum nitride.

7. The filter of claim 5, wherein each of the plurality of bulk acoustic wave resonators further comprises an air cavity disposed between the substrate and the first electrode, wherein a sacrificial air cavity layer pattern for formation of the air cavity is etched by xenon fluoride.

8. The filter of claim 7, wherein the sacrificial air cavity layer pattern is etched after at least one of the first electrode and the second electrode is formed.

9. The filter of claim 5, wherein the plurality of bulk acoustic wave resonators are configured in at least one of a ladder type and a lattice type.

\* \* \* \* \*